US010249756B2

(12) United States Patent
Tu et al.

(10) Patent No.: US 10,249,756 B2
(45) Date of Patent: Apr. 2, 2019

(54) SEMICONDUCTOR DEVICE INCLUDING MEMORY AND LOGIC CIRCUIT HAVING FETS WITH FERROELECTRIC LAYER AND MANUFACTURING METHODS THEREOF

(71) Applicant: TAIWAN SEMICONDUCTOR MANUFACTURING CO., LTD., Hsinchu (TW)

(72) Inventors: Kuo-Chi Tu, Hsin-Chu (TW); Jen-Sheng Yang, Keelung (TW); Sheng-Hung Shih, Hsinchu (TW); Tong-Chern Ong, Taipei (TW); Wen-Ting Chu, Kaohsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/640,127

(22) Filed: Jun. 30, 2017

(65) Prior Publication Data
US 2018/0151746 A1    May 31, 2018

Related U.S. Application Data

(60) Provisional application No. 62/427,444, filed on Nov. 29, 2016.

(51) Int. Cl.
*H01L 29/78* (2006.01)
*G11C 11/22* (2006.01)
(Continued)

(52) U.S. Cl.
CPC .... *H01L 29/78391* (2014.09); *G11C 11/2257* (2013.01); *G11C 11/2273* (2013.01);
(Continued)

(58) Field of Classification Search
CPC ........... H01L 29/78391; H01L 29/6684; H01L 29/516; H01L 27/11592; H01L 27/1159;
(Continued)

(56) References Cited

U.S. PATENT DOCUMENTS

| 5,923,184 A * | 7/1999 | Ooms ..................... H03K 19/08 |
| | | 326/121 |
| 6,080,682 A | 6/2000 | Ibok |

(Continued)

FOREIGN PATENT DOCUMENTS

| CN | 102163609 A | 8/2011 |
| JP | H08-111086 A | 4/1996 |

(Continued)

OTHER PUBLICATIONS

Richard Ulrich et al. "Comparison of Paraelectric and Ferroelectric Materials for Applications as Dielectrics in Thin Film Integrated Capacitors", 2000, International Microelectronis and Packaging Society, vol. 23, No. 2, pp. 172-180.*
(Continued)

*Primary Examiner* — William Coleman
(74) *Attorney, Agent, or Firm* — McDermott Will & Emery LLP

(57) ABSTRACT

A semiconductor device includes a memory circuit and a logic circuit. The memory circuit includes a word line, a bit line, a common line and a memory transistor having a gate coupled to the word line, a drain coupled to the bit line and a source coupled to the common line. The logic circuit includes a field effect transistor (FET) having a gate, a drain and a source. The memory transistor has a gate electrode layer formed on a gate dielectric layer, and the gate dielectric layer includes a first insulating layer and a first ferroelectric (FE) material layer. The FET has a gate electrode layer formed on a gate dielectric layer, and the gate dielectric layer
(Continued)

includes a second insulating layer and a second FE material layer.

20 Claims, 8 Drawing Sheets

(51) Int. Cl.
  *H01L 27/1159* (2017.01)
  *H01L 27/11592* (2017.01)
  *H01L 29/51* (2006.01)
  *H01L 29/66* (2006.01)

(52) U.S. Cl.
  CPC .... *H01L 27/1159* (2013.01); *H01L 27/11592* (2013.01); *H01L 29/516* (2013.01); *H01L 29/6684* (2013.01); *H01L 29/66545* (2013.01)

(58) Field of Classification Search
  CPC ............... H01L 29/66545; H01L 29/78; G11C 11/2273; G11C 11/2257
  See application file for complete search history.

(56) References Cited

U.S. PATENT DOCUMENTS

| | | | |
|---|---|---|---|
| 7,212,429 B2* | 5/2007 | Kang | G11C 5/147 365/145 |
| 7,297,602 B2* | 11/2007 | Hsu | G11C 11/22 257/E21.208 |
| 9,190,135 B2* | 11/2015 | Appenzeller | B82Y 10/00 |
| 9,299,799 B2* | 3/2016 | Dubourdieu | H01L 29/4966 |
| 9,337,045 B2* | 5/2016 | Grass | H01L 21/28194 |
| 9,362,487 B2* | 6/2016 | Inumiya | H01L 43/10 |
| 2007/0215950 A1 | 9/2007 | Aoyama | H01L 21/823842 257/369 |
| 2012/0176829 A1 | 7/2012 | Kang et al. | |
| 2012/0225545 A1 | 9/2012 | Fu et al. | |
| 2013/0258742 A1* | 10/2013 | Noda | G11C 5/025 365/51 |
| 2015/0187763 A1 | 7/2015 | Kim et al. | |
| 2015/0214322 A1* | 7/2015 | Mueller | G11C 11/22 257/295 |
| 2016/0204219 A1 | 7/2016 | Schloesser et al. | |
| 2016/0268271 A1 | 9/2016 | Mueller et al. | |
| 2016/0284720 A1 | 9/2016 | Ema et al. | |
| 2016/0336069 A1 | 11/2016 | Lin | |
| 2017/0186757 A1* | 6/2017 | Tao | H01L 27/11507 |

FOREIGN PATENT DOCUMENTS

| | | |
|---|---|---|
| JP | 2016-184721 A | 10/2016 |
| KR | 10-2015-0077545 A | 7/2015 |
| TW | 464865 B | 11/2001 |

OTHER PUBLICATIONS

Muller, J. et al., "Integration Challenges of Ferroelectric Hafnium Oxide Based Embedded Memory", ECS Transactions, (2015), pp. 85-95, vol. 69, Issue 3.
Ma, T. P., "FEDRAM: A Capacitor-less DRAM Based on Ferroelectric-Gated Field-Effect Transistor", IEEE, (2008), 3 pages.
Boscke, T. S. et al., "Ferroelectricity in Hafnium Oxide: CMOS compatible Ferroelectric Field Effect Transistors", IEEE, (2011), pp. 547-550.
Ma, T. P. "Why is Nonvolatile Ferroelectric Memory Field-Effect Transistor Still Elusive?", IEEE Electron Device Letters, (2002), pp. 386-388, vol. 23, Issue 7.
Ma, T. P., "FEDRAM: A DRAM Cell Based on Ferroelectric-Gated Field-Effect Transistor", IEEE, (2009), pp. 231-234.
Ma, T. P., "FEDRAM: A Capacitor-less DRAM Based on Ferroelectric-Gated Field-Effect Transistor", IEEE [Invited Paper], (2014), 4 pages.
Kim, Kwang-Ho, et al., "IFerroelectric DRAM (FEDRAM)FET With Metal/SrBi2Ta2O9/SiN/Si Gate Structure", IEEE Electron Device Letters, vol. 23, No. 2, Feb. 2002.
Korean Office Action dated Nov. 21, 2018 issued in Korean Patent Application No. 10-2017-0106784 (with English translation).
T.S. Böscke et., "Phase transitions in ferroelectric silicon doped hafnium oxide, " Applied Physics Letters 99, 112904 (2011).

* cited by examiner

SEMICONDUCTOR DEVICE INCLUDING MEMORY AND LOGIC CIRCUIT HAVING FETS WITH FERROELECTRIC LAYER AND MANUFACTURING METHODS THEREOF

CROSS-REFERENCE TO RELATED APPLICATIONS

This application claims priority to U.S. Provisional Patent Application 62/427,444 filed Nov. 29, 2016, the entire disclosure of which is incorporated herein by reference.

TECHNICAL FIELD

The disclosure relates to semiconductor integrated circuits, more particularly to semiconductor devices having ferroelectric memory circuits and logic circuits within one chip, and manufacturing processes thereof.

BACKGROUND

As the semiconductor industry has progressed into nanometer technology process nodes in pursuit of higher device density, higher performance, and lower costs, it is desirable to incorporate and merge logic circuits having a variety of functions with non-volatile memory circuits within one chip. As a non-volatile memory cell, a ferroelectric random access memory (FERAM) offers high density, low power consumption, high speed, and low manufacturing cost. One advantage of the FERAM compared to a static random access memory (SRAM) and/or a dynamic random access memory (DRAM) is its significantly smaller size (about one-third to about one-fourth the size of an SRAM cell).

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Figure 1A:
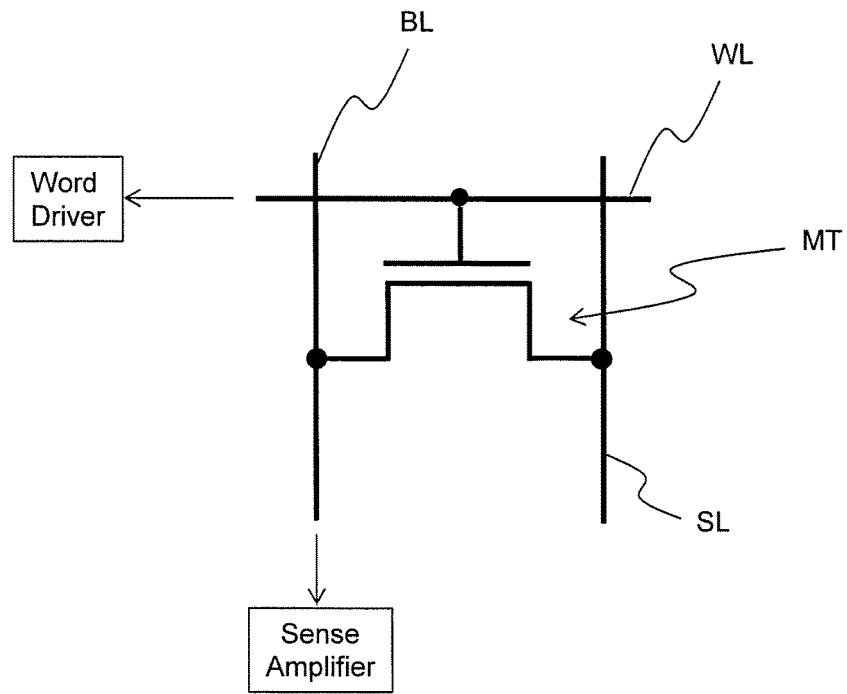
FIG. 1A shows an exemplary circuit diagram of an FERAM cell.
Figure 1B:
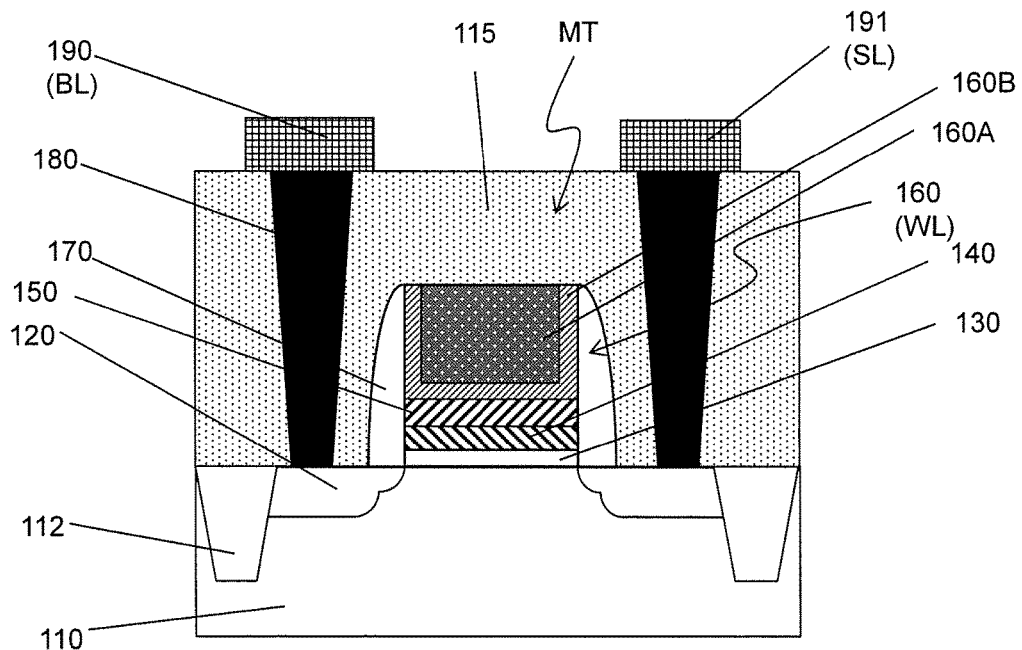
FIG. 1B shows an exemplary cross sectional view of an FERAM cell according to one embodiment of the present disclosure.

In the present embodiment, a semiconductor device includes non-volatile memory (NVM) cells, in particular, ferroelectric (FE) memory cells and logic circuits. In the present disclosure, a 1-transistor (1T) type FERAM is employed. FIG. 1A shows an exemplary circuit diagram of a 1T-type FERAM cell, and FIG. 1B shows an exemplary cross sectional view of the 1T-type FERAM cell according to one embodiment of the present disclosure. A 1T-type FERAM is also called a ferroelectric floating gate random access memory (FFRAM).

As shown in FIG. 1A, one cell of an FERAM circuit includes a word line WL, a bit line BL, a common line SL and a memory transistor MT having a gate coupled to the word line, a drain coupled to the bit line and a source coupled to the common line.

In FIG. 1B, the memory transistor MT is formed on an active region surrounded by an insulating isolation region 112 (also called as shallow trench isolation (STI)) formed on a substrate 110. The memory transistor MT includes an insulating layer 130, a ferroelectric (FE) material layer 140, an intermediate conductive layer 150 and a gate electrode 160 stacked in this order on a channel region of the substrate 110. The combination of the insulating layer 130 and the ferroelectric (FE) material layer 140 may be referred to as a gate dielectric layer. The substrate 110 may be Si, SiGe, SiC, or a group III-V semiconductor. In this embodiment, a Si substrate is used. Source/drain regions 120, having a lightly doped drain (LDD) structure, are also formed in the surface of the substrate 100. The memory transistor MT is covered by an interlayer dielectric (ILD) layer 115, and contacts 180 pass through the ILD layer 115. The contacts 180 connect the drain to a metal wiring 190 (a bit line) and the source to another metal wiring 191 (a common line SL). It is noted that a source and a drain may be interchangeable and these terms may be used merely to distinguish one from another.

A ferroelectric material has a nonlinear relationship between the applied electric field and the stored charge. Specifically, the ferroelectric characteristic has the form of a hysteresis loop, which is very similar in shape to the hysteresis loop of ferromagnetic materials. Semi-permanent electric dipoles are formed in the crystal structure of the ferroelectric material. When an external electric field is applied across a dielectric, the dipoles tend to align themselves with the field direction, produced by small shifts in the positions of atoms and shifts in the distributions of electronic charge in the crystal structure. After the charge is removed, the dipoles retain their polarization state. In a 1T-type FERAM, the remaining polarization state affects a threshold voltage Vt of an FET, and when a voltage is applied, a current value changes depending on the remaining polarization state, thereby storing/reading binary "0" and "1" data.

In the present embodiments, the FE material includes one or more of $Pb_3Ge_5O_{11}$ (PGO), lead zirconate titanate (PZT), $SrBi_2Ta_2O_9$ (SBT or SBTO), $SrB_4O_7$ (SBO), $Sr_aBi_bTa_cNb_dO_x$ (SBTN), $SrTiO_3$ (STO), $BaTiO_3$ (BTO), $(Bi_xLa_y)Ti_3O_{12}$ (BLT), $LaNiO_3$ (LNO), $YMnO_3$, $ZrO_2$, zirconium silicate, ZrAlSiO, $HfO_2$, hafnium silicate, HfAlO, LaAlO, lanthanum oxide, $HfO_2$ doped with Si, and $Ta_2O_5$. A thickness of the FE material layer 140 is in a range from about 1 nm to about 300 nm in some embodiments, and is in a range from about 10 nm to about 100 nm in other embodiments.

The insulating layer 130 is made of one or more layers of insulating material, such as $SiO_2$, SiN and SiON.

The gate electrode 160 is formed by a gate replacement operation, and includes one or more work function adjustment layers 160A and one or more body metal layers 160B. The work function adjustment layer 160A is made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer.

The body layer 160B includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The intermediate conductive layer 150 is one or more layers of conductive material, such as TiN, Ti, TaN and/or W. A thickness of the intermediate conductive layer 150 is in a range from about 1 nm to about 300 nm in some embodiments, and is in a range from about 10 nm to about 100 nm in other embodiments.

The memory transistor MT further includes sidewall spacers 170 made of one of more layers of insulating material, such as $SiO_2$, SiN and SiON. The ILD layer 115 includes one or more layers of silicon based insulating material, such as $SiO_2$, SiN, SiOC, SiCN, SiOCN or SiON formed by chemical vapor deposition (CVD). The thickness of the ILD layer 115 is in a range from about 300 nm to about 1000 nm in some embodiments. The contacts 180 are made of one or more layers of conductive material, such as TiN, TaN, Ti, W, Co, Ni, Cu, Al and silicide. The metal wirings 190, 191 are made of one or more layers of conductive material, such as TiN, TaN, Ti, W, Co, Ni, Cu and Al.

Figure 2A:
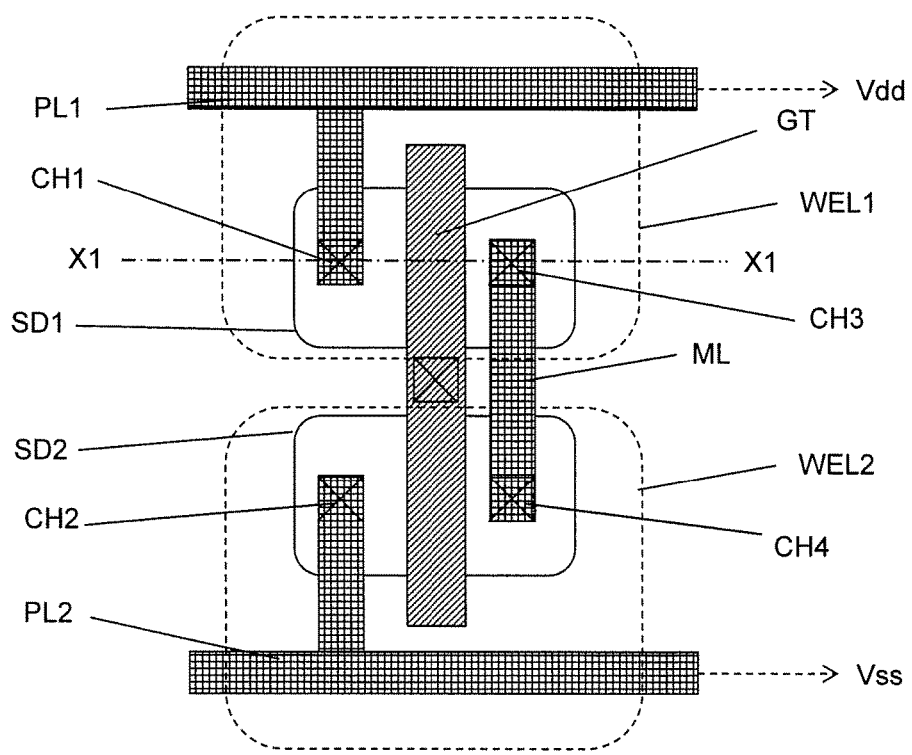
FIG. 2A shows an exemplary circuit layout of an complementary metal-oxide-semiconductor (CMOS) inverter circuit.
Figure 2B:
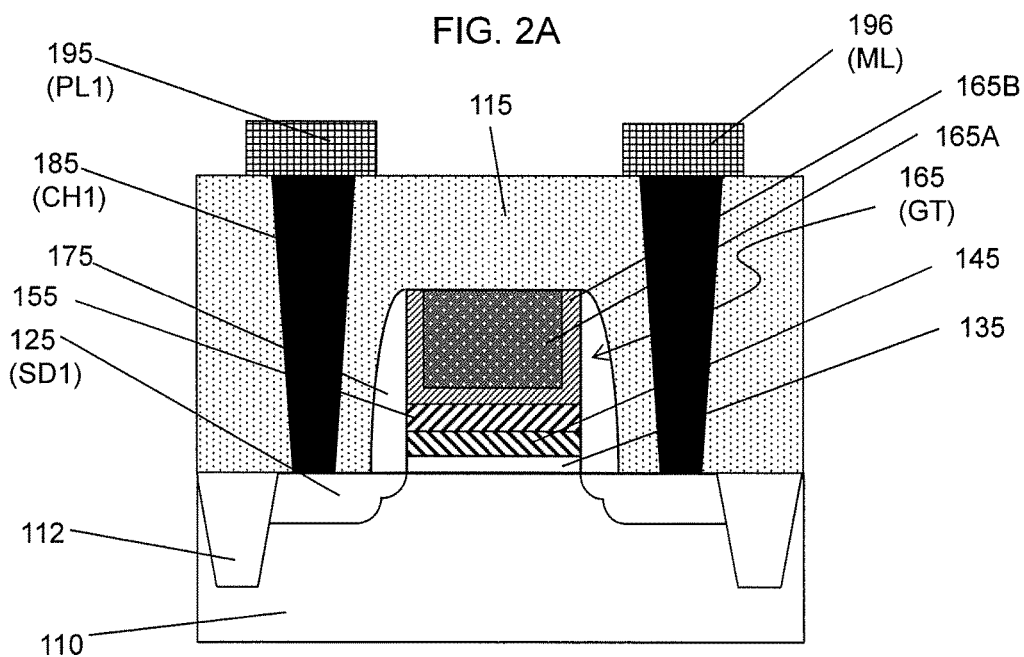
FIG. 2B shows an exemplary cross sectional view of one field effect transistor (FET) of the CMOS invertor according to one embodiment of the present disclosure.

As shown in FIGS. 1B and 2B, the work function adjustment layers 160A and 165A have a U-shape cross section. The intermediate conductive layers 150, 155 do not have a U-shape.

In the present embodiments, logic circuits are formed on a same semiconductor chip as the FE memory circuit. The logic circuits include a basic logic circuit, such as an inverter, an AND circuit, a NAND circuit, an OR circuit and a NOR circuit, each of which is constituted by CMOS FETs. In some embodiments, the logic circuit is one or more of a word deriver and a sense amplifier, or other peripheral circuits of the FERAM. In the present embodiments, the logic circuits include an FET having an FE material layer as a gate insulating layer.

FIG. 2A shows an exemplary circuit layout of an complementary meta-oxide-semiconductor (CMOS) inverter circuit, and FIG. 2B shows an exemplary cross sectional view corresponding to line X1-X1 of FIG. 2A of one field effect transistor (FET) of the CMOS invertor according to one embodiment of the present disclosure. The configurations, materials, dimensions and structures same as or similar to the FERAM as shown in FIG. 1B may be employed in the logic circuits shown in FIGS. 2A and 2B and the detailed explanation thereof may be omitted.

In this embodiment, as one example of the logic circuits, a CMOS inverter is employed.

As shown in FIG. 2A, two wells WEL1 and WEL2 having different polarities are formed in the substrate. In this embodiment, the well WEL1 is an n-well and the well WEL1 is a p-well. An n-type active region SD1 is formed in the p-well WEL1, and a p-type active region SD2 is formed in the n-well WEL2. A first power supply line PL1 is electrically coupled to the drain region via a contact CH1, and a second power supply line PL2 electrically coupled to the drain region via a contact CH2. In this embodiment, the first power supply line PL1 is coupled to Vdd and the second power supply line PL2 is coupled to Vss. A common gate GT is disposed over the active regions SD1 and SD2. A metal wiring ML is an output of the CMOS inverter and coupled to the source regions via contacts CH3 and CH4.

In the cross sectional view of FIG. 2B, an FET is formed on an active region surrounded by an insulating isolation region 112 formed on a substrate 110. The FET includes an insulating layer 135, an FE material layer 145, an intermediate conductive layer 155 and a gate electrode 165 stacked in this order on a channel region of the substrate 110. The combination of the insulating layer 135 and the FE material layer 145 may be referred to as a gate dielectric layer. Source/drain regions 125, having an LDD structure, are also formed in the surface of the substrate 100. The FET is covered by an interlayer dielectric (ILD) layer 115, and contacts 185 pass through the ILD layer 115. The contacts 185 connect the drain to a metal wiring 195 (the first power supply line PL1) and the source to another metal wiring 196 (an output metal wiring ML).

The insulating layer 135 is made of one or more layers of insulating material, such as $SiO_2$, SiN and SiON.

The gate electrode 165 includes one or more work function adjustment layers 165A and one or more body metal layers 165B. The work function adjustment layer 165A is made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer.

The body layer 165B includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The intermediate conductive layer 155 is one or more layers of conductive material, such as TiN, Ti, TaN and/or W. A thickness of the intermediate conductive layer 155 is in a range from about 1 nm to about 300 nm in some embodiments, and is in a range from about 10 nm to about 100 nm in other embodiments.

The FTE further includes sidewall spacers 175 made of one of more layers of insulating material, such as $SiO_2$, SiN and SiON. The ILD layer 115 includes one or more layers of silicon based insulating material, such as $SiO_2$, SiN, SiOC, SiCN, SiOCN or SiON formed by chemical vapor deposition (CVD). The thickness of the ILD layer 115 is in a range from about 300 nm to about 1000 nm in some embodiments. The contacts 185 are made of one or more layers of conductive material, such as TiN, TaN, Ti, W, Co, Ni, Cu, Al and silicide. The metal wirings 195, 196 are made of one or more layers of conductive material, such as TiN, TaN, Ti, W, Co, Ni, Cu and Al.

The FE material layer 145 has the same configuration (the same material and the same thickness) as the FE material layer 140 of the memory transistor MT of the FERAM as shown in FIG. 1B. Here, the "same" means that the FE material layers 140 and 145 are formed at the same time by the same process and allows a variation caused by a process variation. For example, the thicknesses of the FE material layers 140 and 145 may vary about up to 5%.

In contrast, the thickness of the insulating layer 135 is different from the thickness of the insulating layer 130 of the memory transistor MT. In one embodiment, the thickness of the insulating layer 130 of the memory transistor MT is greater than the thickness of the insulating layer 135 of the FET. In such a case, an operational voltage (Vgs) for the FERAM circuit area is higher than that for the logic circuit area. In some embodiments, the thickness of the insulating layer 130 of the memory transistor MT is in a range from about 3 nm to about 15 nm and the thickness of the insulating layer 135 of the FET is in a range from about 1 nm to about 5 nm. In other embodiments, the thickness of the insulating layer 130 of the memory transistor MT is in a range from about 3 nm to about 9 nm and the thickness of the insulating layer 135 of the FET is in a range from about 1 nm to about 3 nm.

In another embodiment, the thickness of the insulating layer 130 of the memory transistor MT is smaller than the thickness of the insulating layer 135 of the FET. In such a case, an operational voltage (Vgs) for the FERAM circuit area is smaller than that for the logic circuit area. In some embodiments, the thickness of the insulating layer 130 of the memory transistor MT is in a range from about 1 nm to about 5 nm and the thickness of the insulating layer 135 of the FET is in a range from about 3 nm to about 15 nm. In other embodiments, the thickness of the insulating layer 130 of the memory transistor MT is in a range from about 1 nm to about 3 nm and the thickness of the insulating layer 135 of the FET is in a range from about 3 nm to about 9 nm.

FIGS. 3-7 show exemplary cross sectional views illustrating a sequential process for manufacturing a semiconductor device having an FERAM circuit and a logic circuit according to one embodiment of the present disclosure. It is understood that additional operations can be provided before, during, and after processes shown by FIGS. 3-7, and some of the operations described below can be replaced or eliminated, for additional embodiments of the method. The order of the operations may be changeable.

Figure 3:
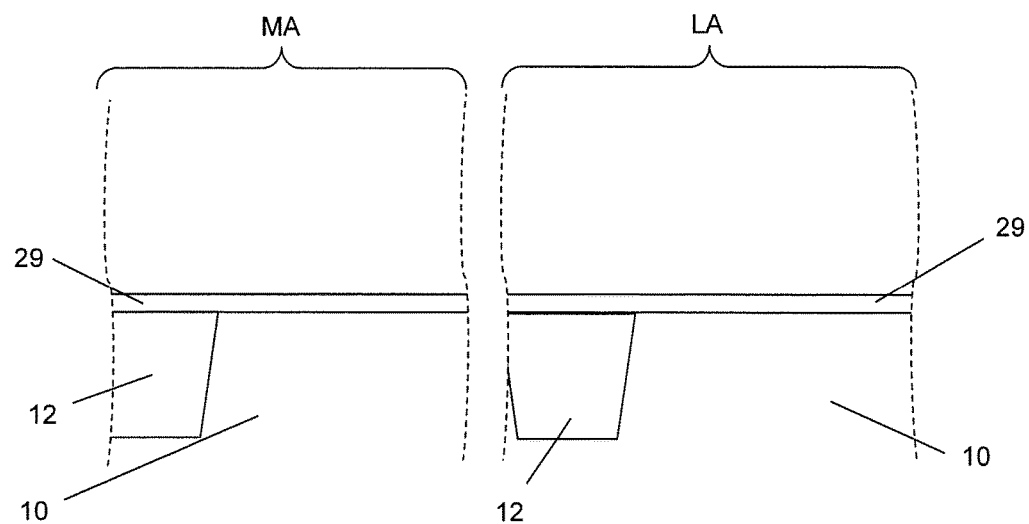
FIGS. 3-7B show exemplary cross sectional views illustrating a sequential process for manufacturing a semiconductor device having an FERAM circuit and a logic circuit according to one embodiment of the present disclosure.

Isolation insulating layers 12, which are also called shallow trench isolation (STI), are formed in a substrate 10 in an FERAM circuit area MA and a logic circuit area LA, as shown in FIG. 3. To form the isolation insulating layer 12, a mask layer including a silicon oxide layer and a silicon nitride layer is formed on the substrate 10, and the mask layer is patterned by lithography and etching operations. Then, by using the patterned mask layer as an etching mask, the substrate 10 is trench-etched to form trenches. A depth of the trenches is in a range from about 100 nm to about 1 μm in some embodiments.

The trenches are filled with an insulating (dielectric) material, and then, a planarization operation, such as chemical mechanical polishing (CMP) or an etch-back process, is performed so as to remove an upper part of the insulating material layer, thereby forming the isolation layers 12. The substrate not etched, and surrounded or separated by the STI in plan view is an active region, over which transistors or other semiconductor devices are formed.

After the isolation layers 12 are formed, an insulating layer 29 is formed over the FERAM cell area MA and the logic circuit area LA, as shown in FIG. 3. The insulating layer 29 is one or more of $SiO_2$, SiN and SiON. Silicon oxide, silicon nitride and/or silicon oxynitride may be formed by thermal oxidation, thermal nitridation, CVD or atomic layer deposition (ALD). Hafnium oxide may be formed by CVD or ALD. The thickness of the insulating layer 29 as deposited is in a range from about 3 nm to about 15 nm in some embodiments, and is in a range from about 3 nm to about 9 nm in other embodiments. In certain embodiments, an $SiO_2$ layer having a thickness of about 2-15 nm is formed by thermal oxidation and the formed $SiO_2$ is subjected to thermal or plasma nitridation to form a SiON layer.

After the insulating layer 29 is formed, the logic circuit area LA is covered by a protective layer 27. The protective layer may be a photoresist, silicon oxide or silicon nitride.

Figure 4:
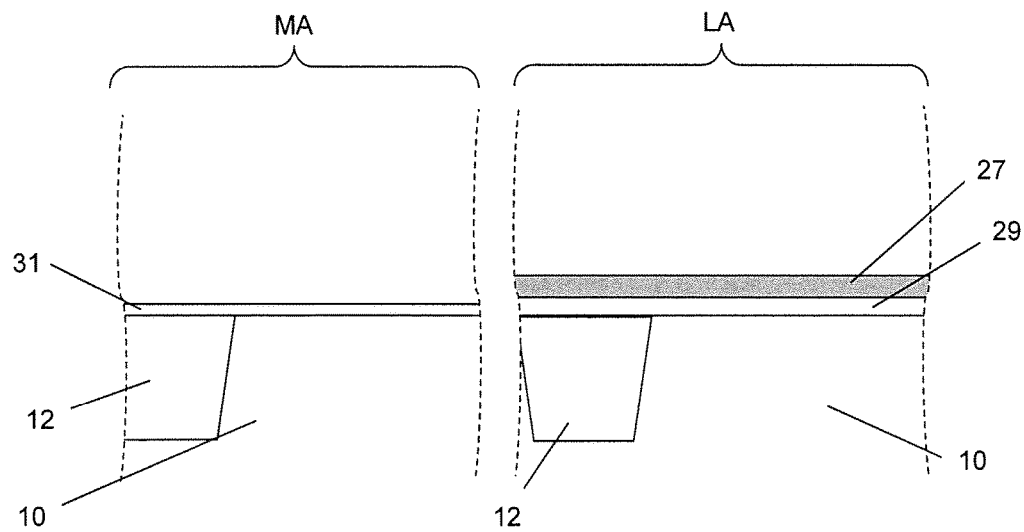

While the logic circuit area LA is covered, the insulating layer 29 in the FERAM circuit area MA is etched to reduce the thickness to a range from about 1 nm to about 5 nm or from about 1 nm to about 3 nm in some embodiments, thereby forming a reduced insulating layer 31, as shown in FIG. 4. The insulating layer 29 may be etched by using dry etching and/or wet etching. In certain embodiments, an atomic layer etching (ALE) is employed to precisely control the remaining thickness of the reduced insulating layer 31.

In some embodiments, the insulating layer 29 in the FERAM circuit area MA is fully removed, and an insulating layer 31 with a desired thickness is newly formed.

Figure 5:
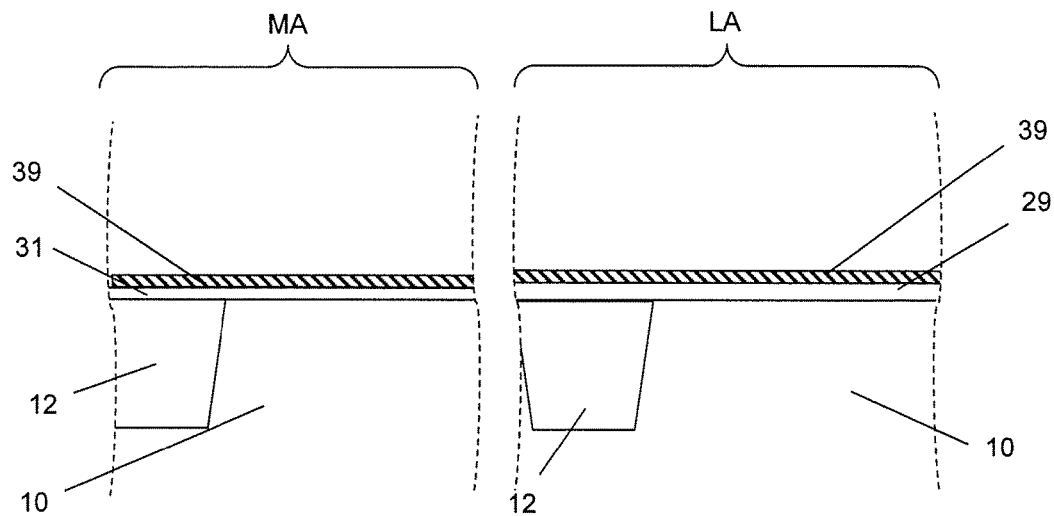

Subsequently, an FE material layer 39 is formed over the insulating layer 31 in the FERAM circuit area MA and the insulating layer 29 in the logic circuit area LA, as shown in FIG. 5. The FE material layer 39 may be formed by CVD, metal-organic chemical vapor deposition (MOCVD), ALD, chemical-solution deposition (CSD) and/or physical vapor deposition (PVD) including sputtering. The thickness of the FE material layer 39 is in a range from about 1 nm to about 300 nm in some embodiments, and is in a range from about 10 nm to about 100 nm in other embodiments.

Figure 6:
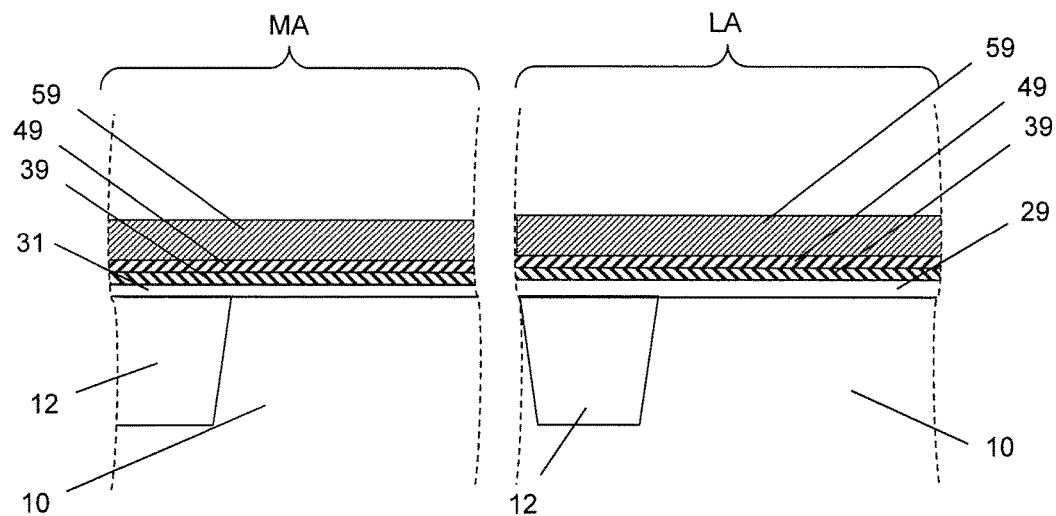

After the FE material layer 39 is formed, a conductive material layer 49 is formed over the FE material layer 39, as show in FIG. 5, and a dummy layer 59 is formed over the conductive material layer 49, as shown in FIG. 6. The conductive material layer 49 is, for example, TiN, TaN, Ti, and/or W. The thickness of the conductive material layer 49 is in a range from about 1 nm to about 300 nm in some embodiments, and is in a range from about 10 nm to about 100 nm in other embodiments. The dummy layer 59 is made of polysilicon or amorphous silicon.

Subsequently, dummy gate layers 60, 65, intermediate conductive layers 50, 55, FE material layers 40, 45 and insulating layers 30, 35 are formed by patterning the dummy layer 59, the conductive material layer 49, the FE material layer 39, the insulating layers 29, 31; doping operations, such as ion implantation, to form source/drain regions 20, 25 and LDD structures are performed; and sidewall spacers 70 and 75 are formed, so as to obtain the structures shown in FIG. 7A. If a gate-first operation is employed, the dummy gate layers 60, 65 are not dummies but become gate electrodes.

Figure 7A:
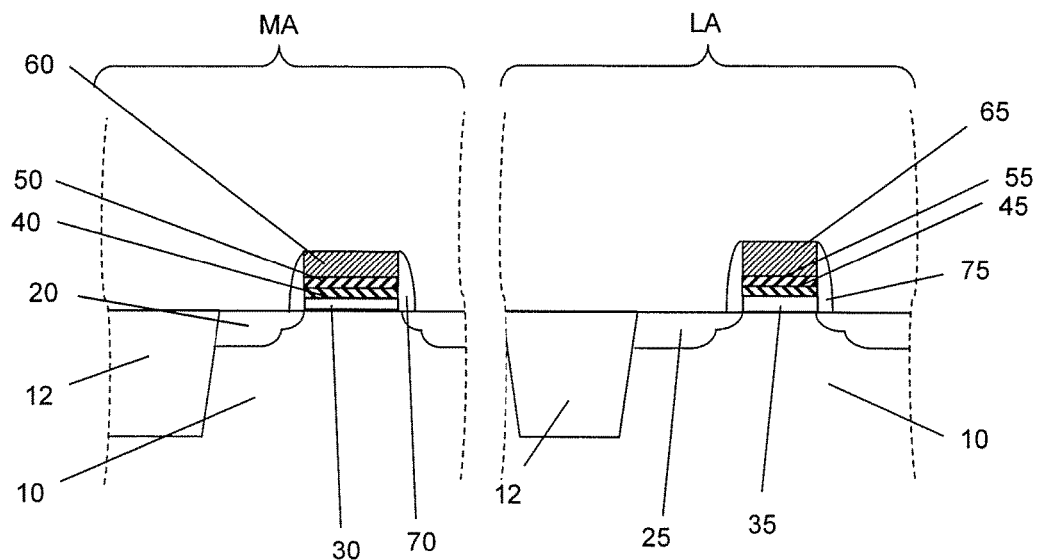
Figure 7B:
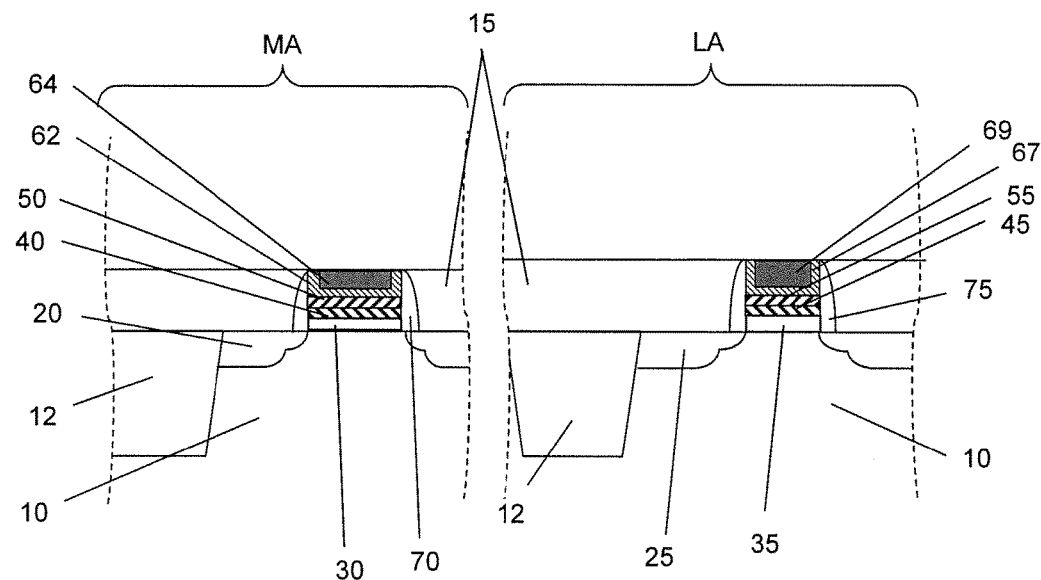

After the structures of FIG. 7A are formed, an interlayer dielectric layer 15 is formed, and a gate replacement operation is performed to replace the dummy gate layers 60, 65 with one or more layers of conductive material. After the interlayer dielectric layer 15 is formed, a planarization operation, such as chemical mechanical polishing (CMP) is performed to as to expose the dummy layers 60, 65, and then the dummy layers 60, 65 are removed so as to form a gate opening. Subsequently, one or more layers of work function material 62 and 67 are formed in the gate opening such that the work function adjustment layer has a U-shape cross section. Then, the remaining gate opening is filled with a metal material 64, 69, and CMP is performed, thereby obtaining the metal gate structures, as shown in FIG. 7B. In some embodiments, a thickness of the gate electrode layer 62, 64 of the memory transistor in the FERAM circuit area MA is different from (e.g., smaller than) a thickness of the gate electrode layer 67, 69 of the FET in the logic circuit area LA.

After the metal gate structure is formed, further FERAM and CMOS processes to form various features such as contacts/vias, metal layers, dielectric layers, passivation layers, etc. are performed.

FIGS. 8-12 show exemplary cross sectional views illustrating a sequential process for manufacturing a semiconductor device having an FERAM circuit and a logic circuit according to another embodiment of the present disclosure. It is understood that additional operations can be provided before, during, and after processes shown by FIGS. 8-12, and some of the operations described below can be replaced or eliminated, for additional embodiments of the method. The order of the operations may be changeable.

Figure 8:
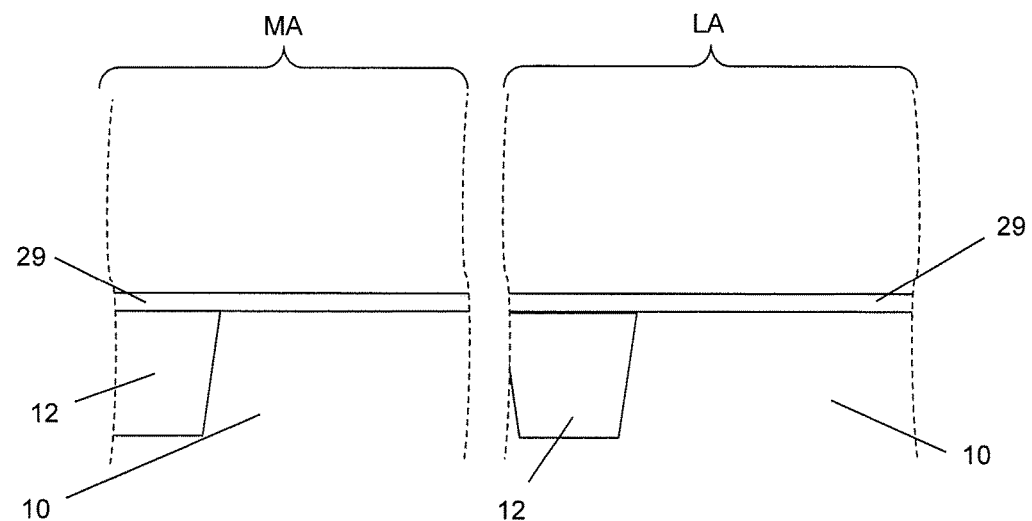
FIGS. 8-12B show exemplary cross sectional views illustrating a sequential process for manufacturing a semiconductor device having an FERAM circuit and a logic circuit according to another embodiment of the present disclosure.

Isolation insulating layers 12, which are also called shallow trench isolation (STI), are formed in a substrate 10 in an FERAM circuit area MA and a logic circuit area LA, as shown in FIG. 8. To form the isolation insulating layer 12, a mask layer including a silicon oxide layer and a silicon nitride layer is formed on the substrate 10, and the mask layer is patterned by lithography and etching operations. Then, by using the patterned mask layer as an etching mask, the substrate 10 is trench-etched to form trenches. A depth of the trenches is in a range from about 100 nm to about 1 μm in some embodiments.

The trenches are filled with an insulating (dielectric) material, and then, a planarization operation, such as CMP or an etch-back process, is performed so as to remove an upper part of the insulating material layer, thereby forming the isolation layers 12. The substrate not etched, and surrounded or separated by the STI in plan view is an active region, over which transistors or other semiconductor devices are formed.

After the isolation layers 12 are formed, an insulating layer 29 is formed over the FERAM cell area MA and the logic circuit area LA, as shown in FIG. 8. The insulating layer 29 is one or more of $SiO_2$, SiN and SiON. Silicon oxide, silicon nitride and/or silicon oxynitride may be formed by thermal oxidation, thermal nitridation, CVD or atomic layer deposition (ALD). Hafnium oxide may be formed by CVD or ALD. The thickness of the insulating layer 29 as deposited is in a range from about 3 nm to about 15 nm in some embodiments, and is in a range from about 3 nm to about 9 nm in other embodiments. In certain embodiments, an $SiO_2$ layer having a thickness of about 2-15 nm is formed by thermal oxidation and the formed $SiO_2$ is subjected to thermal or plasma nitridation to form a SiON layer.

After the insulating layer 29 is formed, the FERAM circuit area MA is covered by a protective layer 28. The protective layer may be photoresist, silicon oxide or silicon nitride.

Figure 9:
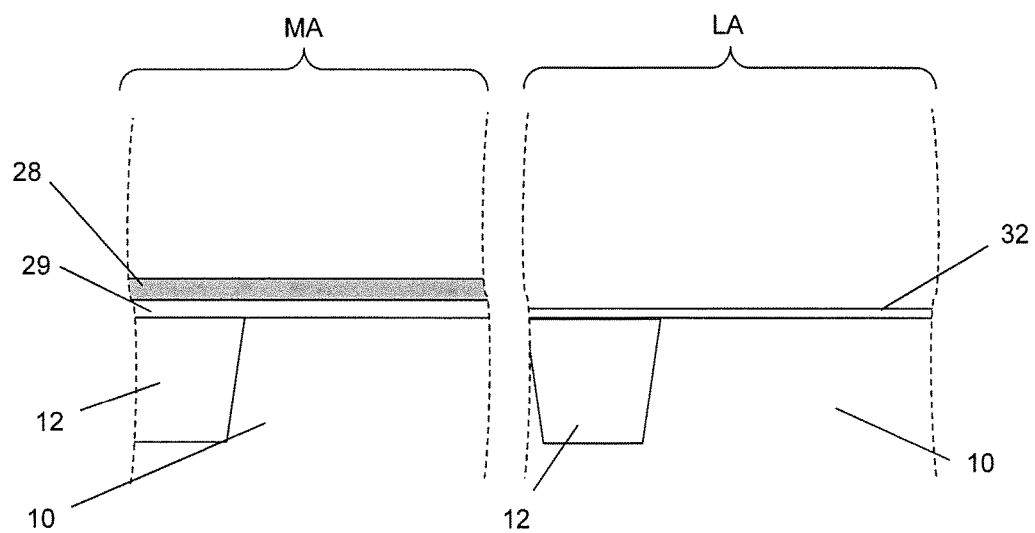

While the FERAM circuit area MA is covered, the insulating layer 29 in the logic circuit area LA is etched to reduce the thickness to a range from about 1 nm to about 5 nm or from about 1 nm to about 3 nm in some embodiments, thereby forming a reduced insulating layer 32, as shown in FIG. 9. The insulating layer 29 may be etched by using dry etching and/or wet etching. In certain embodiments, an atomic layer etching (ALE) is employed to precisely control the remaining thickness of the reduced insulating layer 32.

In some embodiments, the insulating layer 29 in the logic circuit area LA is fully removed, and an insulating layer 32 with a desired thickness is newly formed.

Figure 10:
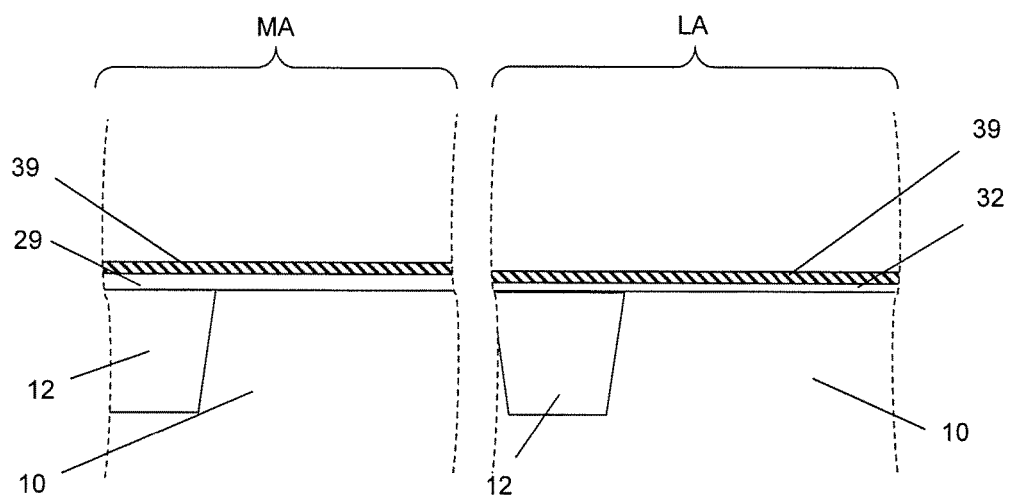
Figure 11:
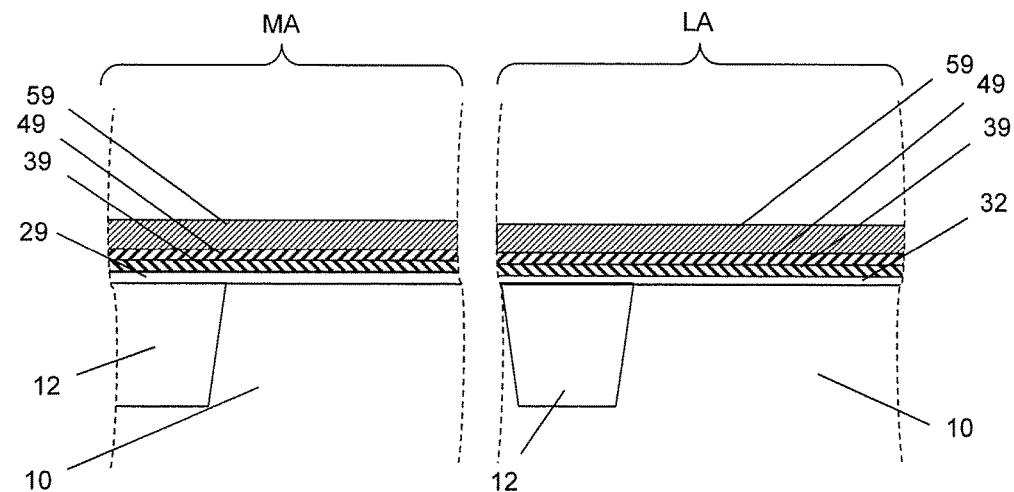

Subsequently, an FE material layer 39 is formed over the insulating layer 29 in the FERAM circuit area MA and the insulating layer 32 in the logic circuit area LA, as shown in FIG. 10. The FE material layer 39 may be formed by CVD, metal-organic chemical vapor deposition (MOCVD), ALD, chemical-solution deposition (CSD) and/or physical vapor deposition (PVD) including sputtering. The thickness of the PE material layer 39 is in a range from about 1 nm to about 300 nm in some embodiments, and is in a range from about 10 nm to about 100 nm in other embodiments.

After the FE material layer 39 is formed, a conductive material layer 49 is formed over the FE material layer 39, as show in FIG. 5, and a dummy layer 59 is formed over the conductive material layer 49, as shown in FIG. 6. The conductive material layer 49 is, for example, TiN, TaN, Ti, and/or W. The thickness of the conductive material layer 49 is in a range from about 1 nm to about 300 nm in some embodiments, and is in a range from about 10 nm to about 100 nm in other embodiments. The dummy layer 59 is made of polysilicon or amorphous silicon.

Subsequently, dummy gate layers 60, 65 are formed by patterning the dummy layer 59, the conductive material layer 49, the FE material layer 39, the insulating layers 29, 31; doping operations, such as ion implantation, to form source/drain regions and LDD structures are performed; and sidewall spacers 70 and 75 are formed, so as to obtain the structures shown in FIG. 12A. If a gate-first operation is employed, the dummy gate layers 60, 65 are not dummies but become gate electrodes.

Figure 12A:
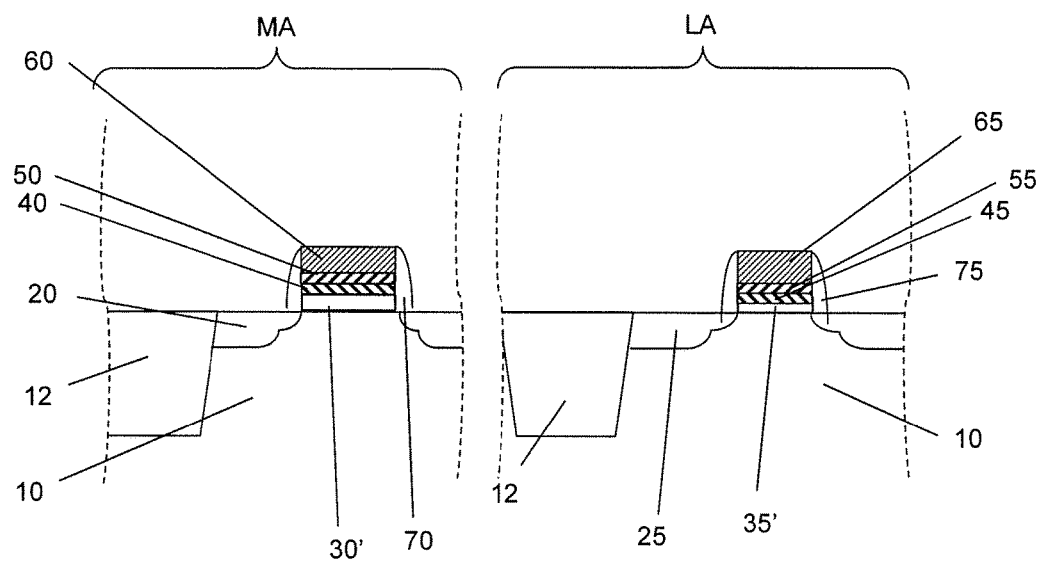
Figure 12B:
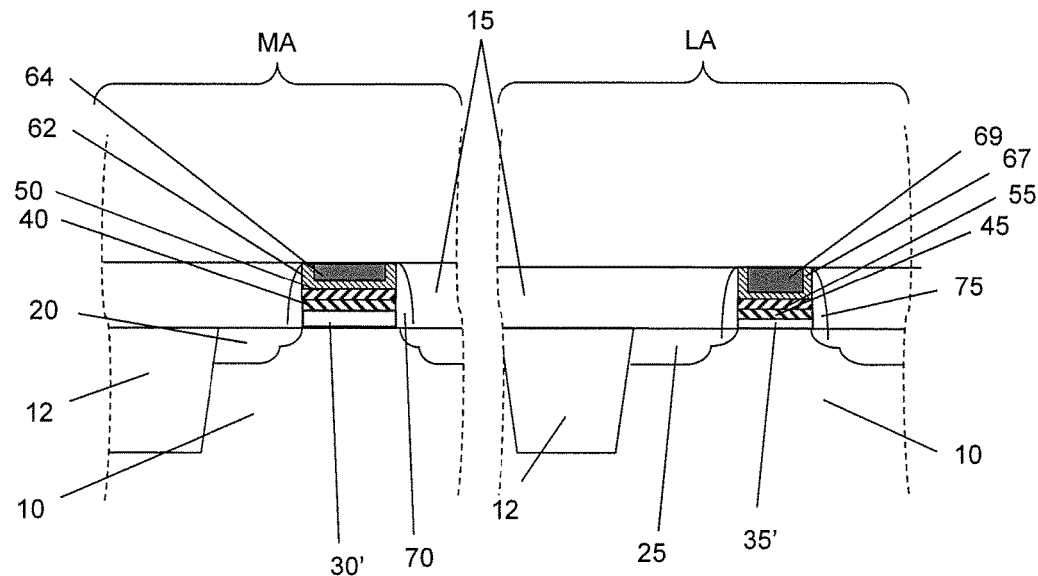

After the structures of FIG. 12A are formed, an interlayer dielectric layer 15 is formed, and a gate replacement operation is performed to replace the dummy gate layers 60, 65 with one or more layers of conductive material. After the interlayer dielectric layer 15 is formed, a planarization operation, such as chemical mechanical polishing (CMP) is performed to as to expose the dummy layers 60, 65, and then the dummy layers 60, 65 are removed so as to form a gate opening. Subsequently, one or more layers of work function material 62 and 67 are formed in the gate opening such that the work function adjustment layer has a U-shape cross section. Then, the remaining gate opening is filled with a metal material 64, 69, and CMP is performed, thereby obtaining the metal gate structures, as shown in FIG. 12B. In some embodiments, a thickness of the gate electrode layer 62, 64 of the memory transistor in the FERAM circuit area MA is different from (e.g., greater than) a thickness of the gate electrode layer 67, 69 of the FET in the logic circuit area LA.

After the metal gate structure is formed, further FERAM and CMOS processes to form various features such as contacts/vias, metal layers, dielectric layers, passivation layers, etc. are performed.

The various embodiments or examples described herein offer several advantages over the existing art.

In the present embodiments, logic circuits having FETs with an FE material layer as a gate dielectric layer are fabricated on the same chip as an FERAM circuit including FERAM cells with an efficient fabrication process. Accordingly, it is possible to reduce or suppress manufacturing cost of semiconductor devices with logic circuits and FERAM circuits on one chip. Further, by adjusting thicknesses of a lower insulating layer of a gate dielectric layer between logic circuits and FERAM circuits, it is possible to realize operable logic circuits with an FE material layer as a part of the gate dielectric layer.

It will be understood that not all advantages have been necessarily discussed herein, no particular advantage is required for all embodiments or examples, and other embodiments or examples may offer different advantages.

In accordance with one aspect of the present disclosure, a semiconductor device includes a memory circuit and a logic circuit. The memory circuit includes a word line, a bit line, a common line and a memory transistor having a gate coupled to the word line, a drain coupled to the bit line and a source coupled to the common line. The logic circuit includes a field effect transistor (FET) having a gate, a drain and a source. The gate of the memory transistor has a gate electrode layer formed on a gate dielectric layer, and the gate dielectric layer includes a first insulating layer and a first ferroelectric (FE) material layer. The gate of the FET has a gate electrode layer formed on a gate dielectric layer, and the gate dielectric layer includes a second insulating layer and a second FE material layer.

In accordance with another aspect of the present disclosure, in a method for manufacturing a semiconductor device including a memory circuit and a logic circuit, an isolation region is formed in a substrate to define a memory area and a logic area. An insulating layer is formed over the memory area and the logic area. A thickness of the insulating layer of the memory area is reduced. A ferroelectric (FE) material layer is formed over the reduced thickness insulating layer of the memory area and the insulating layer of the logic area. A conductive material layer is formed over the FE material layer. The conductive material layer and the FE material layer are patterned. Sidewall spacer layers are formed. A metal gate structure is formed by using agate replacement technology, thereby foil ling a memory gate structure in the memory area and a logic gate structure in the logic area.

In accordance with another aspect of the present disclosure, in a method for manufacturing a semiconductor device including a memory circuit and a logic circuit, an isolation region is formed in a substrate to define a memory area and a logic area. An insulating layer is formed over the memory area and the logic area. A thickness of the insulating layer of the logic area is reduced. A ferroelectric (FE) material layer is formed over the insulating layer of the memory area and the reduced thickness insulating layer of the logic area. A conductive material layer is formed over the FE material layer. The conductive material layer and the FE material layer are patterned. Sidewall spacer layers are formed. A metal gate structure is formed by using agate replacement technology, thereby forming a memory gate structure in the memory area and a logic gate structure in the logic area.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a memory circuit including:
a word line;
a bit line;
a common line; and
a memory transistor having a gate coupled to the word line, a drain coupled to the bit line and a source coupled to the common line; and
a logic circuit including:
a logic transistor having a gate, a drain and a source, wherein:
the gate of the memory transistor has a gate electrode layer formed on a gate dielectric layer, the gate dielectric layer including a first insulating layer and a first ferroelectric (FE) material layer, and
the gate of the logic transistor has a gate electrode layer formed on a gate dielectric layer, the gate dielectric layer including a second insulating layer and a second FE material layer,
wherein a thickness of the first insulating layer is different from a thickness of the second insulating layer.

2. The semiconductor device of claim 1, wherein:
the first FE material layer and the second FE material layer are made of a same FE material and have a same thickness.

3. The semiconductor device of claim 1, wherein a thickness of the first insulating layer is greater than a thickness of the second insulating layer.

4. The semiconductor device of claim 1, wherein a thickness of the first insulating layer is smaller than a thickness of the second insulating layer.

5. The semiconductor device of claim 1, wherein:
the same FE material is $HfO_2$ doped with Si.

6. The semiconductor device of claim 1, wherein the logic circuit includes a CMOS inverter, and the FET is one of two FETs of the CMOS inverter.

7. The semiconductor device of claim 1, wherein the logic circuit is one or more of a word deriver and a sense amplifier of the memory circuit.

8. The semiconductor device of claim 2, wherein:
the same FE material is one of PGO, PZT, SBT, SBO, SBTO, SBTN, STO, BTO, BLT, LNO, $YMnO_3$, $ZrO_2$, zirconium silicate, ZrAlSiO, $HfO_2$, hafnium silicate, HfAlO, LaAlO, lanthanum oxide, $HfO_2$ doped with Si and $Ta_2O_5$.

9. The semiconductor device of claim 2, wherein the same thickness is in a range from 1 nm to 300 nm.

10. The semiconductor device of claim 2, wherein the first and second insulating layers are made of one or more layers of $SiO_2$, SiN and SiON.

11. The semiconductor device of claim 2, wherein the gate electrode layer of the memory transistor and the gate electrode layer of the FET are made of polysilicon.

12. The semiconductor device of claim 2, wherein the thickness of the first and second FE material layer is greater than the thickness of the first insulating layer and the thickness of the second insulating layer.

13. The semiconductor device of claim 3, wherein the thickness of the first insulating layer is in a range from 3 nm to 9 nm and the thickness of the second insulating layer is in a range from 1 nm to 3 nm.

14. The semiconductor device of claim 4, wherein the thickness of the first insulating layer is in a range from 1 nm to 3 nm and the thickness of the second insulating layer is in a range from 3 nm to 9 nm.

15. A semiconductor device, comprising:
a memory circuit including:
a word line;
a bit line;
a common line; and
a memory transistor having a gate coupled to the word line, a drain coupled to the bit line and a source coupled to the common line; and
a logic circuit including:
a logic transistor having a gate, a drain and a source, wherein:
the gate of the memory transistor has a gate electrode layer formed on a gate dielectric layer, the gate dielectric layer including a first insulating layer and a first ferroelectric (FE) material layer,
the gate of the logic transistor has a gate electrode layer formed on a gate dielectric layer, the gate dielectric layer including a second insulating layer and a second FE material layer, and
wherein a thickness of the gate electrode layer of the memory transistor is different from a thickness of the gate electrode layer of the logic transistor.

16. A method for manufacturing a semiconductor device including a memory circuit and a logic circuit, the method comprising:
forming an isolation region in a substrate to define a memory area and a logic area;
forming an insulating layer over the memory area and the logic area;
reducing a thickness of the insulating layer of the memory area;
forming a ferroelectric (FE) material layer over the reduced thickness insulating layer of the memory area and the insulating layer of the logic area;
forming a conductive material layer over the FE material layer;
patterning the conductive material layer and the FE material layer;
forming sidewall spacer layers; and
forming a metal gate structure by using a gate replacement technology, thereby forming a memory gate structure in the memory area and a logic gate structure in the logic area.

17. The method of claim 16, wherein:
the FE material layer is made of $HfO_2$ doped with Si, and the insulating layer is made of $SiO_2$.

18. The method of claim 16, wherein after the reducing a thickness of the insulating layer of the memory area, the thickness of the insulating layer of the logic area is in a range from 3 nm to 9 nm and the thickness of the insulating layer of the memory area is in a range from 1 nm to 3 nm.

19. A method for manufacturing a semiconductor device including a memory circuit and a logic circuit, the method comprising:
forming an isolation region in a substrate to define a memory area and a logic area;
forming an insulating layer over the memory area and the logic area;
reducing a thickness of the insulating layer of the logic area;
forming a ferroelectric (FE) material layer over the insulating layer of the memory area and the reduced thickness insulating layer of the logic area;
forming a conductive material layer over the FE material layer;
patterning the conductive material layer and the FE material layer;
forming sidewall spacer layers; and
forming a metal gate structure by using a gate replacement technology, thereby forming a memory gate structure in the memory area and a logic gate structure in the logic area.

20. The method of claim 19, wherein:
the FE material layer is made of $HfO_2$ doped with Si, and the insulating layer is made of $SiO_2$.

* * * * *